United States Patent
Mooyman-Beck et al.

(10) Patent No.: US 8,384,411 B2
(45) Date of Patent: Feb. 26, 2013

(54) METHOD AND DEVICE FOR MEASURING INTER-CHIP SIGNALS

(75) Inventors: Bart A. Mooyman-Beck, Aloha, OR (US); Robert J. Woolhiser, Beaverton, OR (US); Kevin E. Cosgrove, Portland, OR (US); Daniel G. Knierim, Beaverton, OR (US)

(73) Assignee: Tektronix, Inc., Beaverton, OR (US)

( * ) Notice: Subject to any disclaimer, the term of this patent is extended or adjusted under 35 U.S.C. 154(b) by 143 days.

(21) Appl. No.: 12/642,278

(22) Filed: Dec. 18, 2009

(65) Prior Publication Data
US 2011/0148456 A1    Jun. 23, 2011

(51) Int. Cl.
*G01R 31/02* (2006.01)

(52) U.S. Cl. ......... 324/762.02; 324/762.01; 324/762.03; 257/48; 714/733

(58) Field of Classification Search .............. 257/48; 324/762.01–762.03, 750.3; 714/733
See application file for complete search history.

(56) References Cited

U.S. PATENT DOCUMENTS

| | | | |
|---|---|---|---|
| 2004/0073841 A1* | 4/2004 | Toros et al. | 714/30 |
| 2005/0200005 A1 | 9/2005 | Tanaka | |
| 2007/0067115 A1 | 3/2007 | Canegallo | |
| 2008/0023850 A1* | 1/2008 | Lu et al. | 257/778 |

FOREIGN PATENT DOCUMENTS

WO    2009144828 A1    12/2009

\* cited by examiner

*Primary Examiner* — Bot Ledynh
*Assistant Examiner* — Son Le
(74) *Attorney, Agent, or Firm* — Tetsuo Koyama; Thomas F. Lenihan

(57) ABSTRACT

A method and device for measuring a signal of a die to be placed within a package is disclosed. At least one die as a Device Under Test (DUT) is mounted on a substrate and a chip-type measurement instrument is mounted on the substrate, or embedded into the substrate, wherein the instrument analyzes and/or processes the signal of the DUT and may provide stimulus signal to the DUT. The substrate having the DUT and the measurement instrument is mounted on a circuit board that has plural electrodes to be connected to the signal paths of the DUT and the instrument. An electrode is coupled to a standard interface port to provide the signal of the chip-type instrument to an external instrument.

14 Claims, 9 Drawing Sheets

METHOD AND DEVICE FOR MEASURING INTER-CHIP SIGNALS

FIELD OF THE INVENTION

The present invention relates to the field of test and measurement for measuring a signal of a die to be placed within a package, such as a multi-chip module, and more particularly to a method and device for providing the signal from the die to an outside test and measurement instrument and for providing a signal from an outside test and measurement instrument to a die.

BACKGROUND OF THE INVENTION

With the rise of deep submicron CMOS technologies, integrated circuit designs are becoming more complex incorporating more and more of a system onto a single chip. System interconnects (i.e., signal lines), previously accessible to standard test and measurement equipment, such as oscilloscopes, spectrum analyzers, and the like, are no longer observable. Advanced BIST (Built-In Self-Test) and DFM (Design For Manufacturing)/DFT (Design For Test) approaches are required to verify that the silicon is designed and operating properly. Several companies, such as LogicVision (a part of Mentor Graphics Corporation in Wilsonville, Oreg., USA), are actively attempting to supply solutions to this problem by providing embedded test IP (Intellectual Property). However, this solution cannot solve a problem of not providing a signal to and from an inter-chip signal line to and from an outside test and measurement instrument.

At the same time, speed and signal densities are driving package manufacturers to use advanced technologies such as MCM (Multi-Chip Module) with ceramic and Silicon-Carrier substrates. The MCM can incorporate several dies or bare ICs (Integrated Circuits) as DUTs (Devices Under Test). FIG. 1 shows a magnified perspective view of a conventional MCM 10. It should be noted that the scales of the elements are not the same in FIG. 1. Two dies 12 and 14 as DUTs are mounted on an upper surface of a module substrate 16 made of ceramic and these dies are connected together via one or more conductive paths (shown by dotted lines) in the module substrate 16. The conductive paths may be on surface traces or buried traces, connected with through-holes so as to transmit signals for the DUTs 12 and 14. A lower surface of the ceramic substrate 16 is mounted on an upper surface of an ECB (etched circuit board) 18 having plural electrodes (or pads) 20 so that the conductive paths of the ceramic substrate 16 are electrically connected to the corresponding electrodes 20 of the circuit board 18 via bumps 22. These electrodes 20 are electrically connected to contacts or pins of a MCM package. A specific kind of cover 23 over the dies 12 and 14 would be a hardened liquid, sometimes called "glob". Other standard kinds of covers can be a single IC cover, epoxied to the package, or a multichip module cover, epoxied, bolted or screwed to the module.

The above described configuration shown in FIG. 1 allows for significant portions of the system to be pulled together into a single package. This creates the same problem for signal assessability and observability as seen with advanced CMOS designs. To date, no one has offered a solution to observability for package integration.

JTAG architecture was standardized by IEEE std. 1149.1-1990 as Standard Test Access Port and Boundary-Scan Architecture. FIG. 2 shows a simplified block diagram of a conventional IC 30 using JTAG architecture. The IC 30 comprises an inherent IC function block 32, "PIN Test" blocks 34 each inserted between a terminal of the inherent IC function block 32 and a respective contact "I/O PIN", test logic blocks 36 and 38 each connected between contacts "Test Data In" and "Test Data Out", and a test access port controller 40 connected to contacts "Test Clock", "Test Reset" and "Test Mode Select". The contacts "Test Data In" and "Test Data Out" are connected to both of the lowest "PIN Test" blocks 34. In a normal operation of the IC 30, each "PIN Test" block 34 connects its respective contact "I/O PIN" to the inherent IC function block 32, so that the blocks 36-40 do not operate. In BST (Boundary Scan Test) mode, test data at the contact "Test Data In" is applied to a selected terminal of the inherent IC function block 32 via the "PIN Test" blocks 34 and an output from a selected terminal of the inherent IC function block 32 is applied to the contact "Test Data Out" via the "PIN Test" block 34 under control of the test access port controller 40 that is controlled by a signal from the contact "Test Mode Select". However, this test mode is difficult to program and needs skilled test engineers. In addition, the test circuits, such as the test logic block and the test access port controller, should be contained in the IC 30 as the DUT. Recently, JTAG architecture has used not only the boundary scan test mode but also a communication method. Therefore, a signal at a desired terminal of the inherent IC function block 32 can be provided from the contact "Test Data Out" to circuitry external to the IC 30 under control of the "PIN Test" blocks 34. In this manner, the contact "Test Data Out" acts as a JTAG interface port.

Applying JTAG architecture to the MCM 10 shown in FIG. 1, a plurality of specified electrodes 42 of the circuit board 18 are connected via the signal paths to specified terminals of the die 14 and are further connected to a JTAG interface port. This is shown in the drawings as a simple, generic, interface and called out as "JTAG or other interface ports". The JTAG implementation takes more than one physical path of connections. In the prior art shown in FIG. 2, five extra pins involved to implement JTAG would be more typical. In order to avoid this complexity, FIG. 1 is simplified. One skilled in the art will recognize that another appropriate interface port may be used instead of the JTAG interface port. Therefore, the desired signals of the dies 12 and 14 can be read from the JTAG interface port. Since the JTAG architecture is implemented, the dies 12 and 14 should include the test circuit. Moreover, integration of systems onto single die and multi-chip modules make observability and accessibility of system signals difficult.

What is needed is a method and device for measuring inter-chip signals by leading such signals to the outside of the module and measuring such signals with a conventional test and measurement instrument, recognizing that such methods and circuits will also lend themselves to applying stimulus signals to the DUT.

SUMMARY OF THE INVENTION

Accordingly, the present invention provides a method and device for measuring a signal of a die to be placed within a package. At least one die of a DUT and a chip-type measurement instrument are mounted on an insulating substrate, such as a ceramic substrate. The insulating substrate includes at least one conductive path for electrically connecting the die to the chip-type measurement instrument and another conductive path for electrically connecting the chip-type measurement instrument to an electrode at a surface of the insulating substrate. The insulating substrate is mounted on a circuit board so as to electrically connect the electrode of the insulating substrate to an electrode of the circuit board so that the chip-type measurement instrument is electrically connected to the electrode of the circuit board. An interface port, such as a JTAG interface port, is provided at the circuit board and electrically connected to an electrode of the circuit board. A signal is transferred between the die and the interface port through the chip-type measurement instrument. For example, an output signal of the chip-type measurement instrument is able to be read from the interface port by an external measurement instrument for measuring a signal relating to the signal of the die. A stimulus signal may be applied to a die from or through the chip-type measurement instrument.

The present invention further provides a method and device for measuring a signal of a die to be placed within a package. At least one die is mounted on a semiconductor substrate, such as a silicon carrier substrate. The semiconductor substrate includes a chip-type measurement instrument embedded in the semiconductor substrate, at least one first conductive path for electrically connecting the die to the measurement instrument and at least one second conductive path for electrically connecting the chip-type measurement instrument to an electrode on a surface of the semiconductor substrate. The semiconductor substrate is mounted on a circuit board so as to electrically connect the electrode of the semiconductor substrate to an electrode of the circuit board so that the chip-type measurement instrument is electrically connected to the electrode of the circuit board. An interface port, such as a JTAG interface port, is provided at the circuit board and electrically connected to an electrode of the circuit board. A signal is transferred between the die and the interface port through the chip-type measurement instrument. For example, an output signal of the chip-type measurement instrument is able to be read from the interface port by an external measurement instrument for measuring a signal relating to the signal of the die. A stimulus signal may be applied to a die from the chip-type measurement instrument or from the outside through the chip-type measurement instrument. A cross point switch may be embedded into the semiconductor substrate for selectively connecting one or more of the first conductive paths to the embedded measurement instrument. Either a memory or a programmable logic circuit or both of them may be embedded into the semiconductor substrate.

The present invention provides a device to be placed within a package wherein the device comprises a die, a circuit board having at least one first electrode and a first interposer provided between the die and the circuit board. The first interposer includes at least one first conductive path for electrically connecting the die to the first electrode of the circuit board. A measurement instrument is embedded into a second semiconductor interposer that is inserted between the die and the first interposer. The second semiconductor interposer includes at least one first conductive path for electrically connecting the die to the first conductive path of the first interposer. The first conductive path of the second interposer is electrically connected to the embedded measurement instrument. The circuit board includes at least one second electrode that is electrically connected to an interface port, such as a JTAG interface port. The first interposer includes at least one second conductive path for electrically connecting the embedded measurement instrument to the second electrode of the circuit board. A signal is transferred between the die and the interface port through the embedded measurement instrument. For example, an output signal of the embedded measurement instrument is able to be read from the interface port by an external measurement instrument for measuring a signal relating to the signal of the die. A stimulus signal may be applied to a die from the embedded measurement instrument or from the outside through the embedded measurement instrument. When the second semiconductor interposer is a silicon carrier substrate, the conductive paths of the second silicon carrier substrate may include through-silicon-vias. A cross point switch may be embedded into the semiconductor substrate for selectively connecting one or more of the first conductive paths to the embedded measurement instrument. Either a memory or a programmable logic circuit or both of them may be embedded into the semiconductor substrate.

The objects, advantages and other novel features of the present invention are apparent from the following detailed description when read in conjunction with the appended claims and drawing.

DETAILED DESCRIPTION

Figure 1:
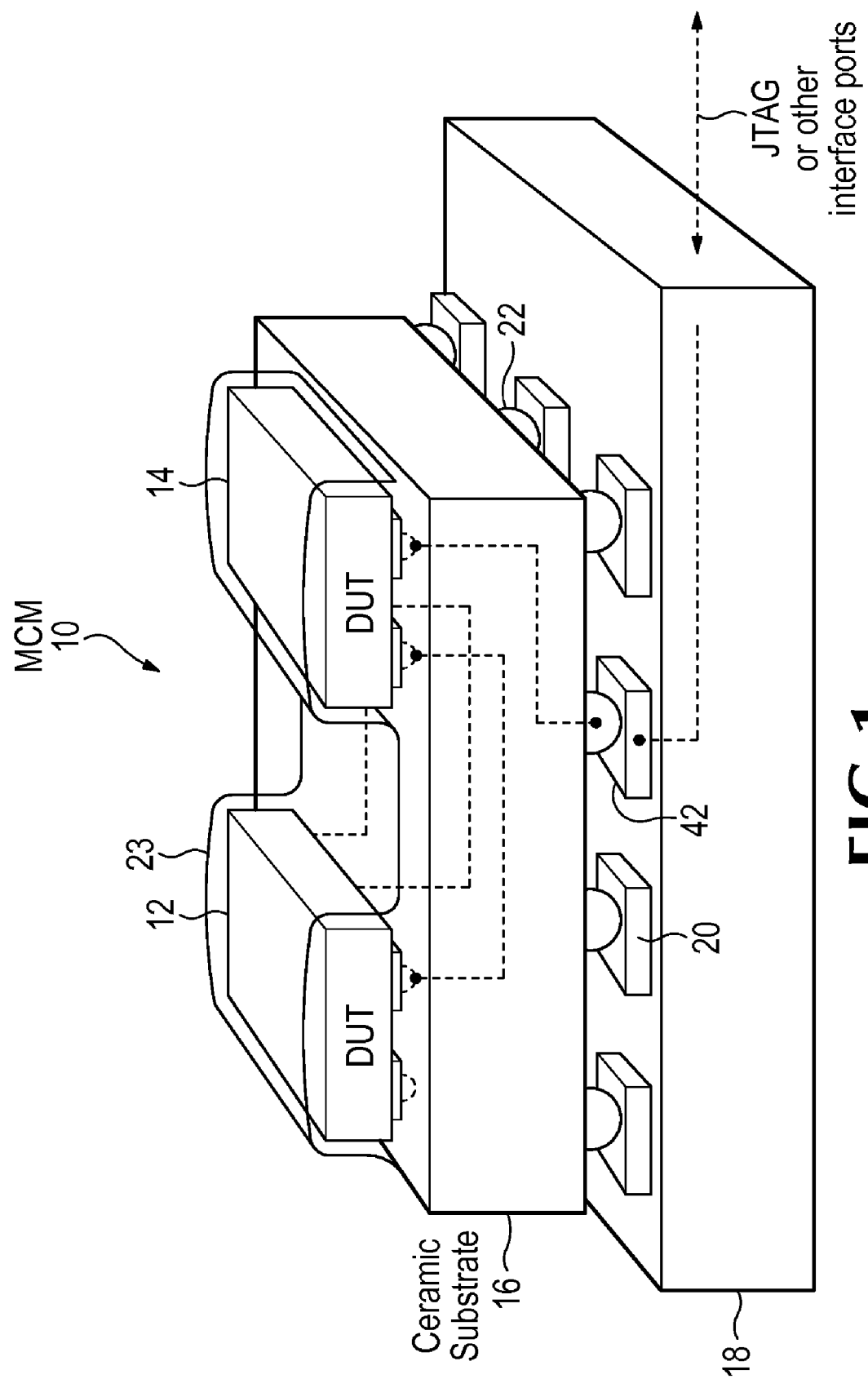
FIG. 1 is a magnified perspective view of a conventional multi-chip module, as known from the prior art.
Figure 3:
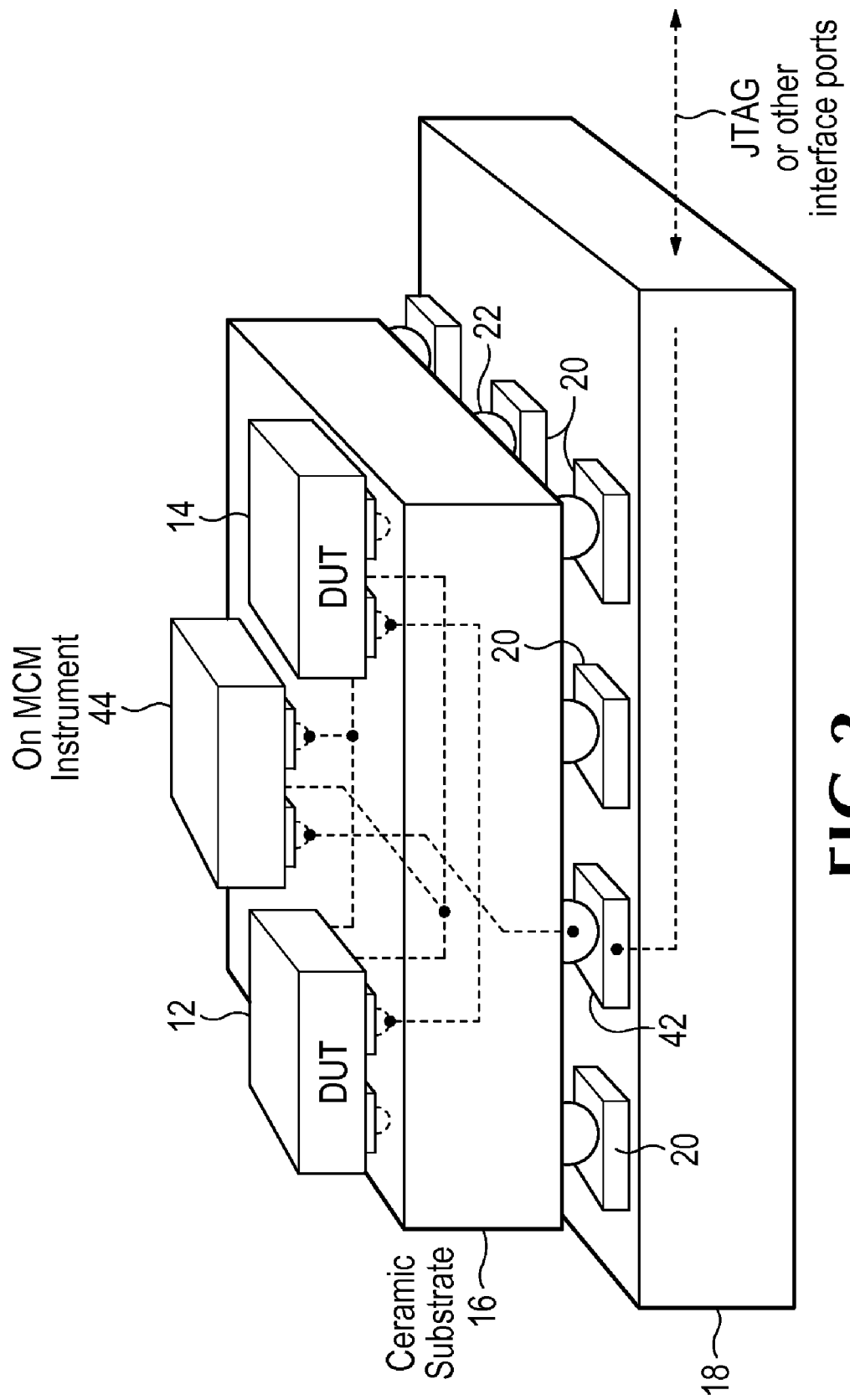
FIG. 3 is a magnified perspective view of a first embodiment of an inter-chip signal measurement device according to the present invention.

Detailed descriptions of the embodiments according to the present invention will be made wherein the same reference numbers for the drawings have been employed to designate like elements. FIG. 3 is a magnified perspective view of a first embodiment of an inter-chip signal measurement device according to the present invention wherein the scales of the elements are not the same. Similarly to the prior art shown in FIG. 1, two dies 12 and 14 as DUTs are mounted on an upper surface of an insulating module substrate 16 and these dies 12 and 14 are connected together via one or more conductive paths or metal coated through-holes (shown by dotted lines) in the insulating substrate 16. The insulating substrate 16 may be a ceramic substrate, and any desired number of dies may be mounted on the ceramic substrate 16. However, according to the present invention, a chip-type measurement instrument 44 is mounted on the ceramic substrate 16 and is electrically connected to the signal paths between the two dies 12 and 14 so that the measurement instrument 44 can detect signals of, and supply signals, such as stimulus signals, to the dies 12 and 14. It should be noted that the measurement instrument 44 may have a measurement function and/or a signal generation function. Since multiple dies are mounted on the ceramic substrate 16, it is called a multi-chip module (MCM). Therefore, the chip-type measurement instrument 44 on the ceramic substrate 16 may be called an "On-MCM Measurement instrument".

Figure 2:
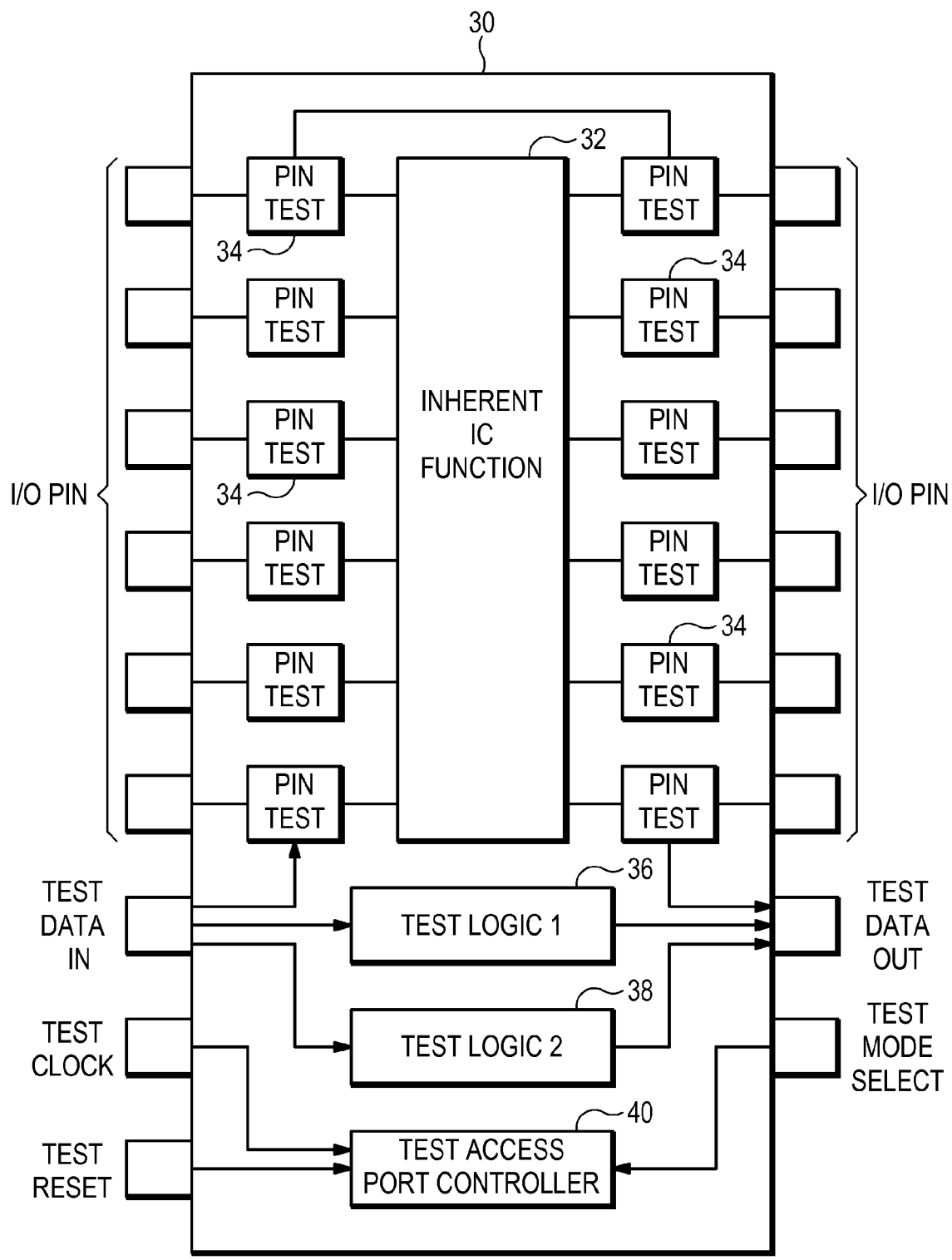
FIG. 2 is a simplified block diagram of a conventional integrated circuit using JTAG architecture, as known from the prior art.

A lower surface of the ceramic substrate 16 is mounted on an upper surface of an ECB (etched circuit board) 18. The circuit board 18 includes plural electrodes (pads) 20 so that the conductive paths of the ceramic substrate 16 are electrically connected to the corresponding electrodes 20 of the circuit board 18 via bumps 22. The electrodes 20 might be solder pads, in the case of a BGA package, or might be contacts, in the case of an LGA package. The bumps 22 depict a solder ball used in the BGA instance, and could be some other contact feature in a different package interconnect technology. These electrodes 20 are electrically connected to contacts or pins of an MCM package. In addition, the circuit board 18 further includes a plurality of special electrodes 42 that are electrically connected to a JTAG interface port described hereinbefore by reference to FIG. 2. This is shown in FIG. 3 as a simple, generic, interface and called out as "JTAG or other interface ports". The JTAG implementation takes more than one physical path of connections as explained hereinbefore. This situation will be applied to FIGS. 4 through 9 that will be discussed hereinafter. The chip-type measurement instrument 44 is electrically coupled to the electrodes 42 through the conductive paths in the ceramic substrate 16 and the corresponding bumps 22. Therefore, the chip-type measurement instrument 44 is electrically connected to the JTAG interface port. As noted above, another appropriate interface port can be used instead of the JTAG interface port. A specific kind of cover over the dies 12 and 14 would be a hardened liquid, sometimes called "glob". Other standard kinds of covers can be a single IC cover, epoxied to the package, or a multichip module cover, epoxied, bolted or screwed or otherwise affixed to the module.

Since the chip-type measurement instrument 44 is mounted on the ceramic substrate 16, signals of the dies 12 and 14 as the DUTs can be read from these dies. Therefore, the measurement instrument 44 can acquire signals and/or supply signals, such as stimulus signals sequentially or simultaneously, to perform analysis and information management before sending the processed data off the module to an external standard test and measurement system (having a signal source function) or computer for storage or additional analysis. The external system or computer is coupled electrically to the JTAG interface port. It should be noted that the On-MCM measurement instrument 44 interfaces with the external or off-MCM analysis system via a standard interface such as a JTAG port. Control of the chip-type measurement instrument 44 could also be accomplished via a set of measurement instrument controller bus signals, or use of a standard interface. Attachment of signals to a logic analyzer as the On-MCM measurement instrument 44 would be done by direct connection within the ceramic substrate 16, to die signals or DUT signals of interest. The On-MCM measurement instrument 44 might be turned off, or removed prior to production, for normal MCM functioning. Due to the extremely short length of the connection between the DUT 12 or 14 and the On-MCM measurement instrument 44, high quality signal measurements are possible.

Figure 4:
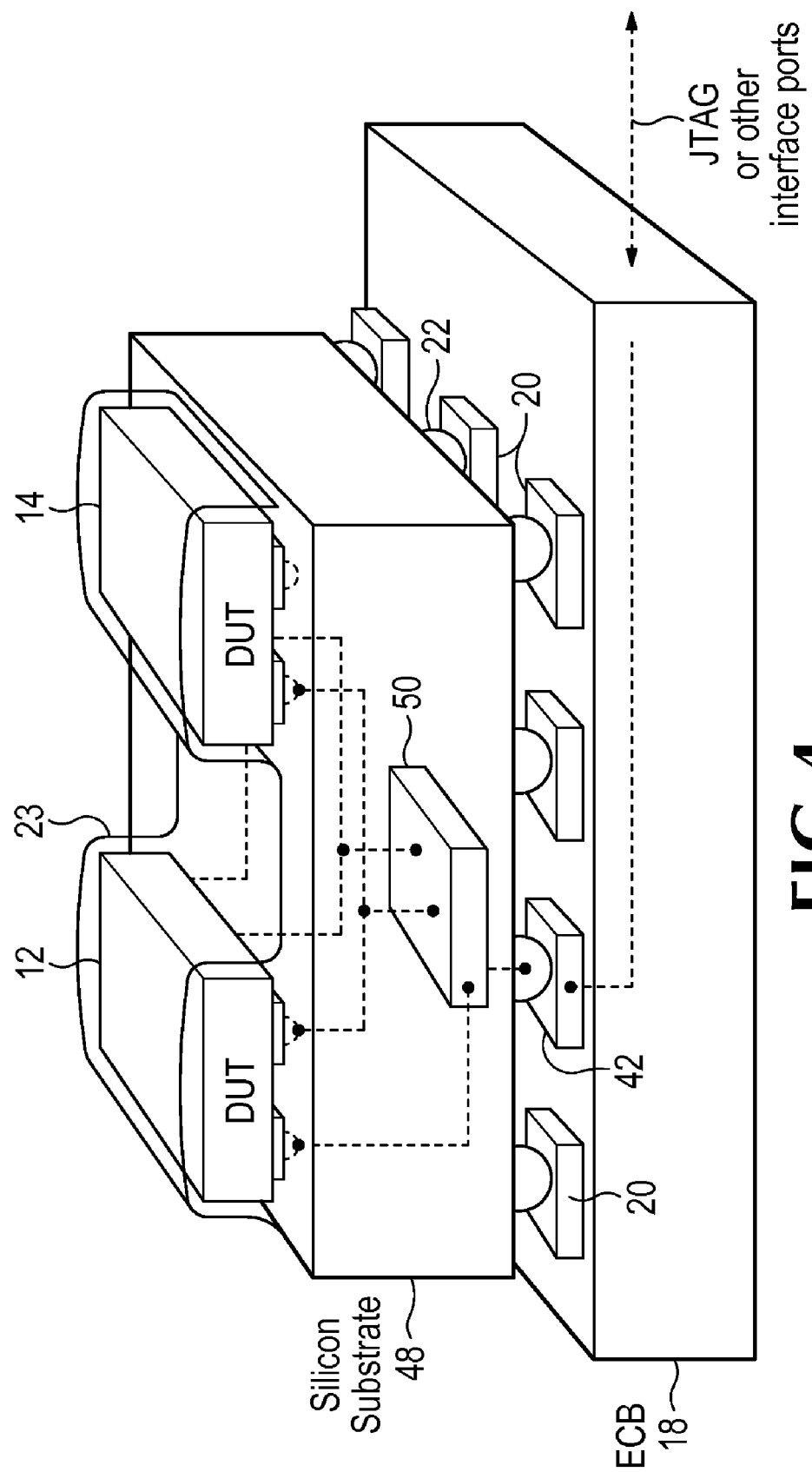
FIG. 4 is a magnified perspective view of a second embodiment of an inter-chip signal measurement device according to the present invention.

FIG. 4 is a magnified perspective view of a second embodiment of an inter-chip signal measurement device according to the present invention wherein the scales of the elements are not the same. This embodiment is similar to that of FIG. 3, so that the same reference numbers have been employed to designate like elements and only the differences will be discussed. This embodiment uses a semiconductor substrate 48, such as a silicon carrier substrate, instead of the ceramic substrate. Therefore, a measurement instrument 50 can be embedded into the silicon substrate 48. The embedded measurement instrument 50 may have a measurement function and/or a signal generation function similarly to the chip-type measurement instrument 44 in FIG. 3. Signal paths (represented by dotted lines) in the silicon carrier substrate 48 act in the same fashion as those in the embodiment shown in FIG. 3. The silicon carrier substrate 48 is mounted on the etched circuit board 18 so that the conductive paths in the silicon carrier substrate 48 are electrically connected to the electrodes (pads) 20 including the electrodes (pads) 42 for the JTAG interface port.

In this embodiment shown in FIG. 4, advantage is taken of the silicon carrier's unique ability to place active circuitry into the substrate 48. In this regard, the entire On-MCM measurement instrument (shown in FIG. 3) can be embedded into the silicon-carrier substrate 48. This saves space and allows for better connection to signals of interest.

As with the ceramic On-MCM measurement instrument, the embedded measurement instrument 50 would interface to an external test and measurement instrument, such as an Off-MCM logic analysis system, through a standard port such as the JTAG interface port. The test control signal may be applied from the instrument 50 or from the external test and measurement instrument.

In this embodiment, the embedded measurement instrument 50 could be delivered to the silicon-carrier as RTL (Register Transfer Language/Level). The RTL would be synthesized and then put down in the silicon-carrier as a standard cell block. The connections of the On-MCM instrument 50 to the functional signals of interest would be done either be direct route, or by merging RTL. As described above, the test control signal would connect the test points (or the cross point) to the logic signals during test mode. The embedded MCM measurement instrument 50 might be turned off during normal MCM functioning or removed prior to production.

Figure 5:
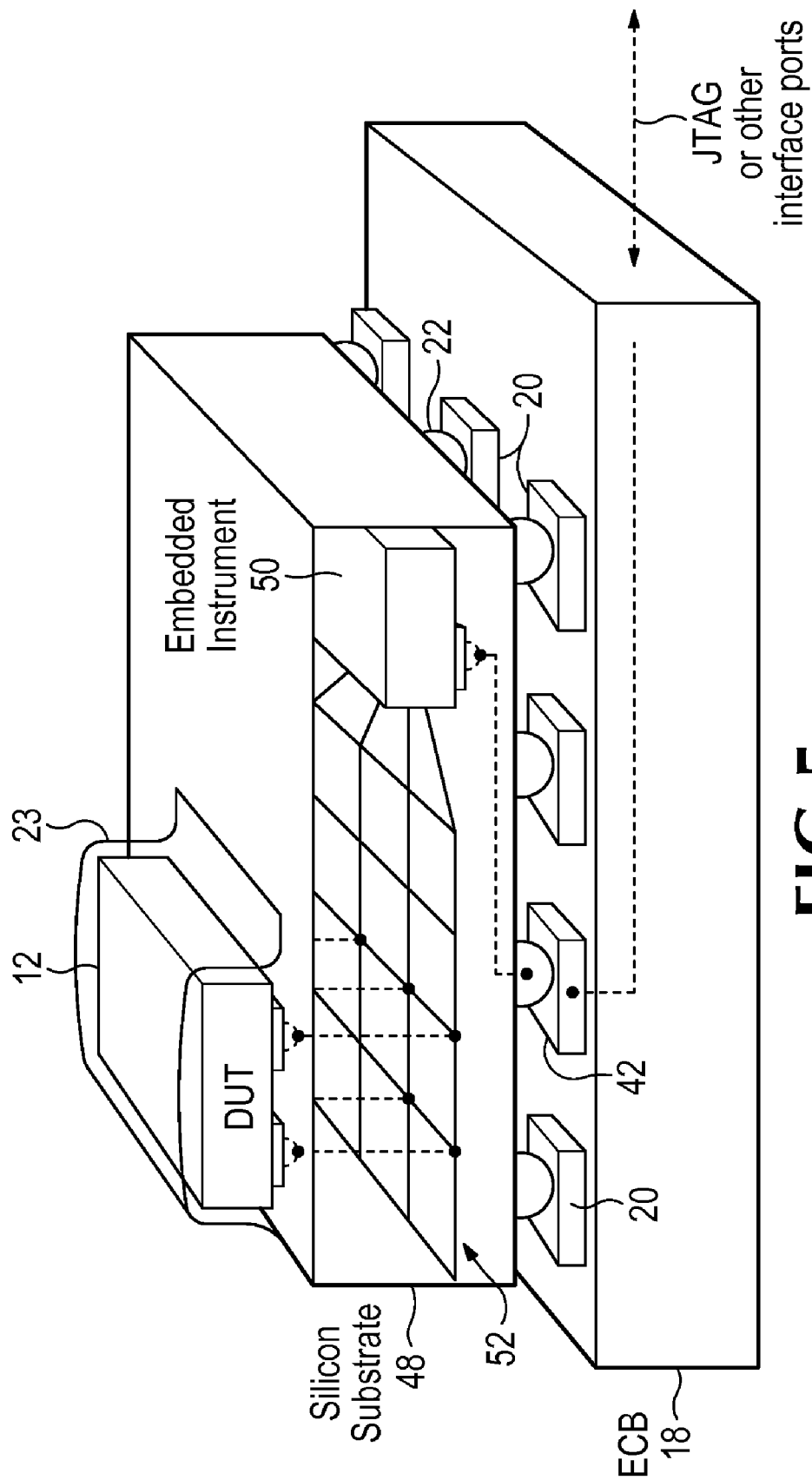
FIG. 5 is a magnified perspective view of a third embodiment of an inter-chip signal measurement device according to the present invention.

FIG. 5 is a magnified perspective view of an embodiment according to the present invention wherein the scales of the elements are not the same and the die 14 is eliminated. This embodiment is similar to that of FIG. 4 so that the same reference numbers have been employed to designate like elements and only the differences will be discussed. In addition to probing signals from and supplying signals to the die 12, the silicon-carrier substrate 48 provides the opportunity to connect the entire set of die (DUT) pads to a cross-point switch (shown by matrix lines 52) built into the substrate 48 which could then route both stimuli and sense points to and from the embedded instrument 50, increasing signal observability by more than an order of magnitude. In other words, the cross-point switch 52 can be used to route measured signals from the die 12 to the embedded measurement instrument 50. This also works in the opposite direction; stimulus signals can route through the cross-point switch 52 from the embedded measurement instrument 50 to the die 12. These two functions may be used separately or in combination. Multiple measurement and stimulus signal paths may be connected at the same time. Nothing prevents the measurement and stimulus paths from being the same, and there are times when this might be useful.

Figure 6:
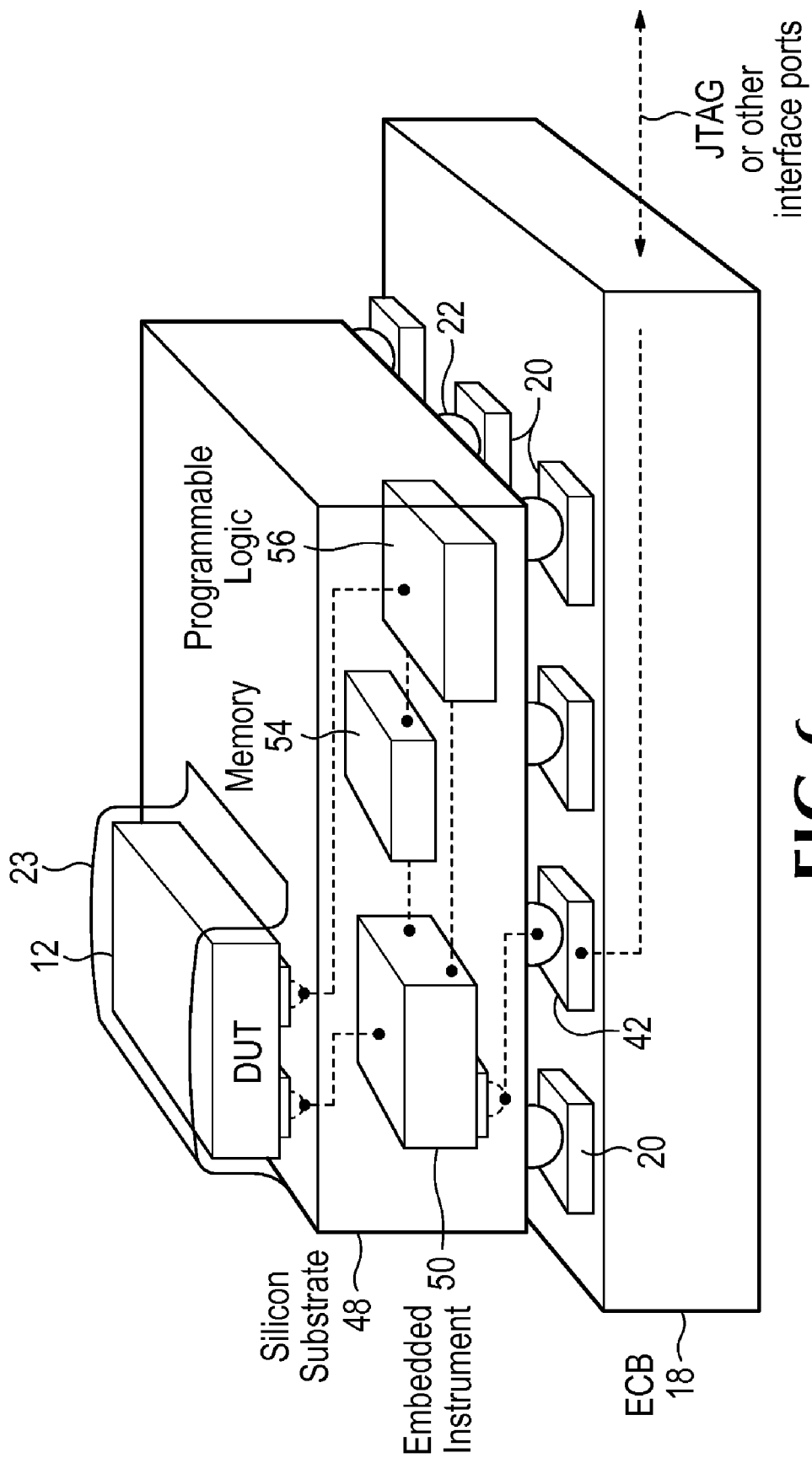
FIG. 6 is a magnified perspective view of a fourth embodiment of an inter-chip signal measurement device according to the present invention.

FIG. 6 is a magnified perspective view of a further embodiment according to the present invention wherein the scales of the elements are not the same and the die 14 is eliminated. This embodiment is similar to that of FIG. 4 so that the same reference numbers have been employed to designate like elements and only the differences will be discussed. A memory 54 or programmable logic circuitry 56 or both of them can be added to silicon-carrier substrate 48 as an additional die attached to the surface (not shown), or as part of the substrate itself (depending on the underlying IC technology) in order to enable specialized customer or third-party definable embedded instrument functionality. The embedded measurement instrument 50, the embedded memory 54 and the embedded programmable logic circuit 56 are electrically interconnected with each other and further connected to the electrodes 42 if necessary. In summary of this embodiment, the memory and programmable logic may be used independently, or with each other. In addition, an instrument controller may be embedded too. The embedded measurement instrument 50 or embedded instrument controller may be distributed in part inside the programmable logic circuitry 56. The memory 54 can be a resource for any embodiment of the embedded instrument. The memory 54 would be useful for storing representations of one or more measurement or representations of one or more stimulus.

Figure 7:
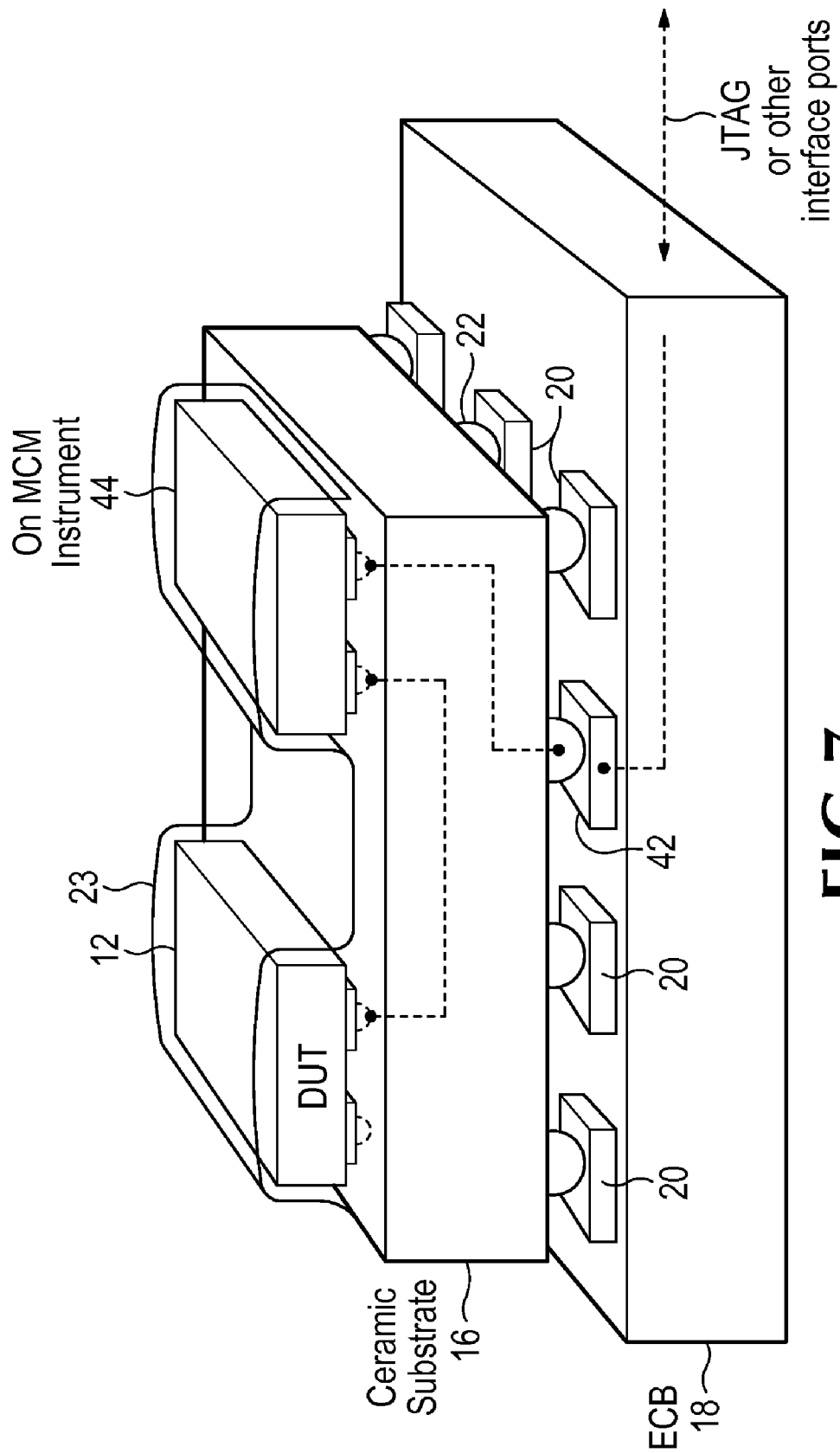
FIG. 7 is a magnified perspective view of a fifth embodiment of an inter-chip signal measurement device according to the present invention.

FIG. 7 is a magnified perspective view of a further embodiment according to the present invention wherein the scales of the elements are not the same. This embodiment is similar to that of FIG. 3 so that the same reference numbers have been employed to designate like elements and only the differences will be discussed. The difference between the embodiments shown FIGS. 3 and 7 is that the former embodiment is applied to a multi-chip module but the latter embodiment is applied to a single-chip module. Therefore, in FIG. 7, only the die 12 as the DUT is shown.

Figure 8:
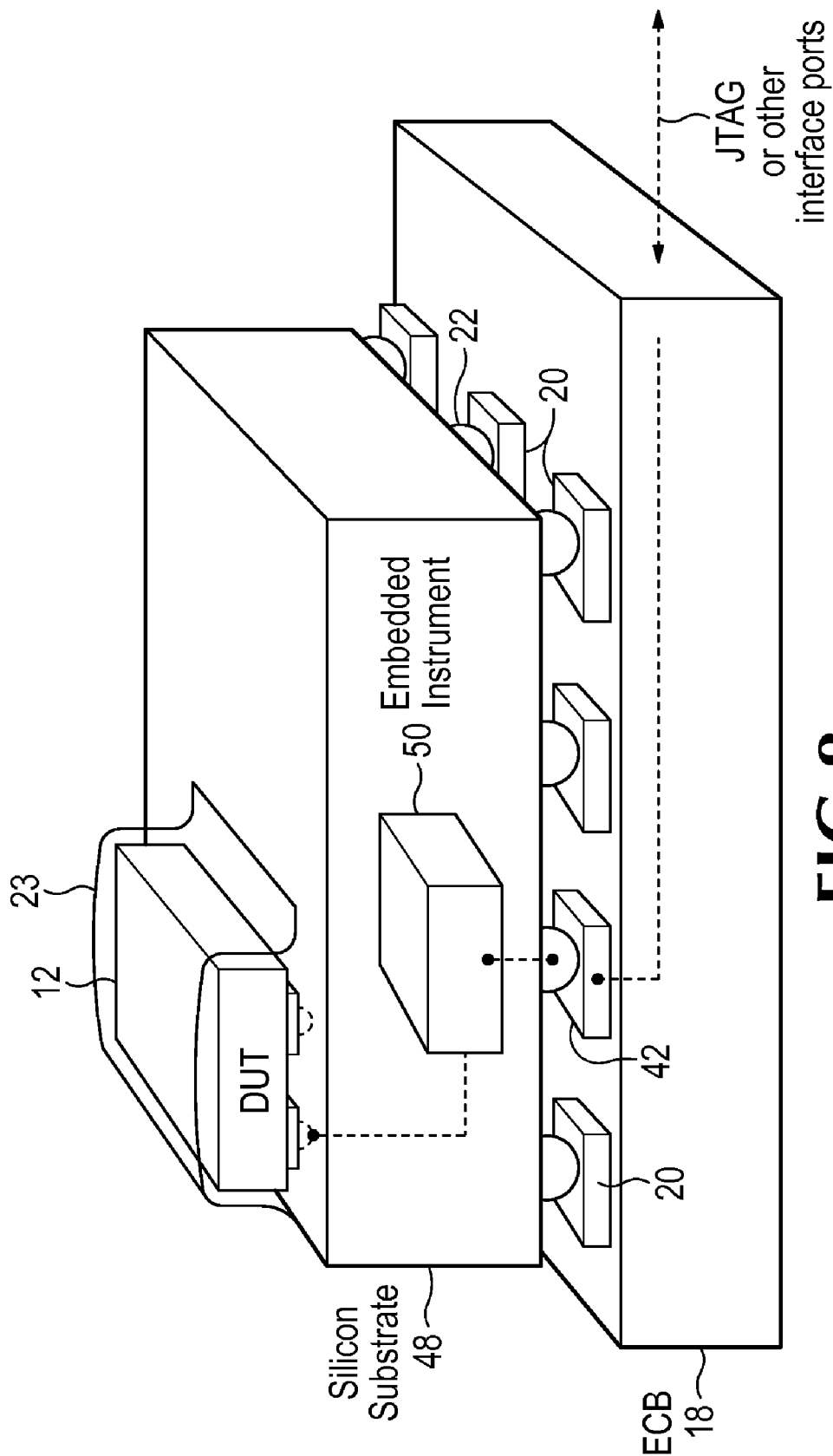
FIG. 8 is a magnified perspective view of a sixth embodiment of an inter-chip signal measurement device according to the present invention.

FIG. 8 is a magnified perspective view of an additional embodiment according to the present invention wherein the scales of the elements are not the same. This embodiment is similar to that of FIG. 4 so that the same reference numbers have been employed to designate like elements and only the differences will be discussed. The difference between the embodiments shown FIGS. 4 and 7 is that the former embodiment is applied to the multi-chip module but the latter embodiment is applied to a single-chip module. Therefore, in FIG. 8, only the die 12 as the DUT is shown.

In the embodiment shown in FIGS. 7 and 8, after supplying an MCM (Ceramic or silicon-carrier based) with a mounted test instrument (On-MCM instrument 44 or embedded instrument 50) to a customer, the customer can then mount their die as the DUT onto the test MCM in order to analyze internal signals. The customer's DUT would then supply internal signal states or values to the instrument 44 or 50 for analysis or data management by either direct connection to the instrument 44 or 50, or by the DUT piping out internal signals to the instrument 44 or 50. The instrument would then communicate to external standard test and measurement systems (not shown) via a standard port, such as the JTAG interface port.

Figure 9:
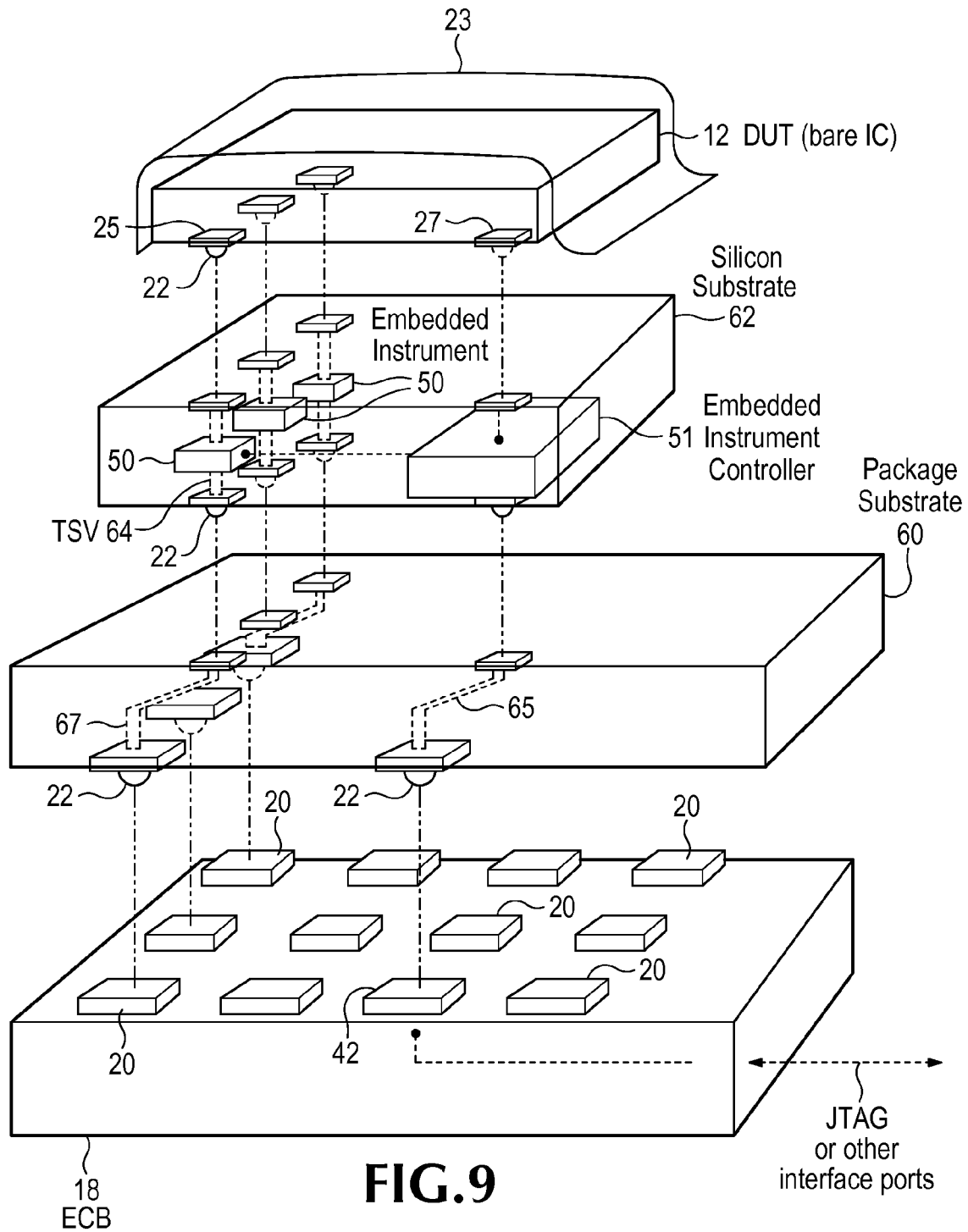
FIG. 9 is an exploded perspective view of a seventh embodiment of an inter-chip signal measurement device according to the present invention.

FIG. 9 is an exploded perspective view of an embodiment of an inter-chip signal measurement device according to the present invention. This embodiment is slightly similar to that of FIG. 8 so that the same reference numbers have been employed to designate like elements. This embodiment is proper for C4 technology (Controlled Collapse Chip Connection technology) because of pre-designed C4 pad pairs at the XY locations of the target DUT's C4 bumps.

A die or a bare IC 12 as a DUT has electrodes or pads 25 and 27 at predetermined positions of the bottom side thereof. The additional pads 27 are used for communicating with an instrument controller 51 that will be discussed hereinafter. The die 12 is coated by a cover 23 if necessary. A first interposer 60 is a package substrate having signal paths 67 at the predetermined positions and electrodes or pads are provided at both ends of the signal paths 67. Therefore, these pads are provided at both top and bottom surfaces of the package interposer 60. A second semiconductor interposer 62 is a silicon-carrier substrate having signal paths 64 at predetermined positions. The signal paths 64 may comprise TSVs (Through-Silicon Vias). Electrodes or pads are provided at both ends of the TSVs 64 and these pads are provided at both top and bottom surfaces of the second silicon interposer 62. Similarly to the embodiments shown in FIGS. 4 and 8, measurement instruments 50 are embedded into the silicon substrate 62. In this embodiment, a measurement instrument 50 is provided at each TSV 64 so that the measurement instruments 50 detect signals at the TSVs 64 or supply stimulus signals to the die 12 through the TSVs 64. In addition, the instrument controller 51 is embedded into the silicon substrate 62 to control the embedded measurement instruments 50 and to receive the output signals from the instruments 50 (only one signal path between the instrument and the controller is shown but the other instruments may be controlled by the controller). The first interposer 60 has additional signal paths 65 as dedicated signal paths for the instrument controller 51. An etched circuit board 18 has pads or electrodes 20 at predetermined positions to mate with the signal paths 67 and special pads 42 for the signal paths 65 of the embedded instrument controller 51. The pads 42 are electrically connected to the JTAG interface port or other appropriate interface port. If the DUT 12 itself contains a JTAG port (as represented by pads 27), the embedded instrument controller 51 may be equipped with TSVs so that it may optionally pass JTAG commands through the controller 51 to the JTAG port of the DUT 12.

When assembling this chip, the die 12 is mounted on the second interposer 62 to mate the pads at the bottom surface of the die 12 to the pads at the top surface of the second interposer (silicon-carrier substrate) 62 through bumps 22. Then, the second interposer 62 is mounted on the first interposer 60 (package substrate) to mate the pads at the bottom surface of the interposer 62 to the pads at the top surface of the first interposer 60 through bumps 22. The first interposer 60 is mounted on the circuit board 18 to couple the pads at the bottom surface of the interposer 60 to the pads at the top surface of the circuit board 18 through bumps 22. The assembly process could proceed in a different order if necessary. In this fashion, the signals of the die or DUT 12 is analyzed or processed by the embedded measurement instruments 50 under control of the embedded instrument controller 51. The output signals from the instruments 50 are representative of the signal of the DUT 12 and are applied to an outside test measurement instrument or computer (not shown) through the embedded instrument controller 51, the test signal paths 65, the pads 42 and the JTAG interface port. A signal, such as a stimulus signal, from the embedded measurement instruments 50 may be applied to the DUT 12 under control of the embedded instrument controller 51. When the DUT 12 is not being tested, the second interposer 62 is not required and the DUT 12 may be mounted directly on the first interposer 60. When in the test mode, where the second interposer 62 is inserted between the die 12 and the first interposer (package substrate) 60, only the height of the package is changed.

In the embodiment of FIG. 9, the second interposer 62 can be used during the product development and debug stages, but eliminated during volume production, if desired, to save manufacturing cost. No redesign of the DUT or its package is necessary to allow use of the test interposer 62 or to remove it for cost savings during volume production. The pre-designed embedded measurement instruments 50 and corresponding pad pairs are available in a variety of types, depending on C4 function. For example, power pad pairs may consist of a through-silicon via, and a high-resolution ADC to monitor voltage drop using a known current source for a reference.

This allows the measurement of power supply current flow on a per-bump basis, allowing verification of electromigration current-flow simulations and aiding in tracking down unexpected power draw in the DUT (even if the underlying package contains a power plane that shorts all C4 power bumps together).

Digital pad pairs may consist of a through-silicon via and a high-impedance tap to a logic analyzer function. Analog pad pairs may consist of a through-silicon via and a high-impedance tap to an oscilloscope function (Equivalent-Time or short-record Real-Time). JTAG pad pairs may intercept the JTAG traffic to the DUT, and can either interpret the JTAG commands locally (to interface with the test functionality of all other pad pairs) or pass them through to the DUT to exercise the DUT's JTAG functionality. Of course, other functions could be added to these pad pairs as well. For example, TDR capability can be added to debug package and circuit board interconnect problems. Other functions can also be added, including, but not limited to, RF sensing and/or generation, a protocol-aware High-Speed Serial function (with Eye-diagram capabilities), and the like. A major advantage of this approach is that the design of a DUT and its package (except for lid height) need not be impacted by the inclusion of test capability, and the test interposer itself is quickly designed (assuming the pad pairs have been previously designed and are just being placed and interconnected according to the DUT's needs). This allows for debug and test functionality to be added to a system at minimal impact to the system architecture or program schedule. Another major advantage is that it removes the trade-off between test coverage and manufacturing cost. Test coverage is provided for every pin of the DUT, but the test interposer can be removed from the system once in production so there is no manufacturing cost penalty for having provided that test coverage during system development.

Although various embodiments, which incorporate the techniques of the present invention have been shown and described in detailed herein, those skilled in the art will readily understand that many other varied embodiments may be incorporated using these techniques, and all are intended to lie within the scope of the following claims. For instance, the topology of FIG. 9 may readily be adapted for test of a wire-bond DUT through use of stacked-die technology.

What is claimed is:

1. A device for measuring a signal of a die to be placed within a package, comprising:
   a semiconductor substrate on which at least one die is mounted, said semiconductor substrate having a measurement instrument embedded in said semiconductor substrate, at least one first conductive path for electrically connecting said die to said measurement instrument and at least one second conductive path for electrically connecting said measurement instrument to an electrode on a surface of said semiconductor substrate;
   a circuit board on which said semiconductor substrate is mounted so as to electrically connect the electrode of said semiconductor substrate to an electrode of said circuit board so that said measurement instrument is electrically connected to the electrode of said circuit board; and
   an interface port provided at said circuit board and electrically connected to the electrode of said circuit board;
   wherein a signal is transferred between said die and said interface port through said measurement instrument; and
   further comprising a cross point switch embedded in said semiconductor substrate for selectively connecting said first conductive paths to said embedded measurement instrument for applying a signal from said die to said embedded measurement instrument.

2. The device as recited in claim 1 wherein said cross point switch embedded in said semiconductor substrate selectively connects said first conductive paths to said embedded measurement instrument for applying a signal from said embedded measurement instrument to said die.

3. A device for measuring a signal of a die to be placed within a package, comprising:
   a semiconductor substrate on which at least one die is mounted, said semiconductor substrate having a measurement instrument embedded in said semiconductor substrate, at least one first conductive path for electrically connecting said die to said measurement instrument and at least one second conductive path for electrically connecting said measurement instrument to an electrode on a surface of said semiconductor substrate;
   a circuit board on which said semiconductor substrate is mounted so as to electrically connect the electrode of said semiconductor substrate to an electrode of said circuit board so that said measurement instrument is electrically connected to the electrode of said circuit board; and
   an interface port provided at said circuit board and electrically connected to the electrode of said circuit board;
   wherein a signal is transferred between said die and said interface port through said measurement instrument; and
   further comprising a cross point switch embedded in said semiconductor substrate for selectively connecting said first conductive paths to said embedded measurement instrument for simultaneously applying a signal from said die to said embedded measurement instrument and a signal from said embedded measurement instrument to said die.

4. The device as recited in claim 3 further comprising either a memory or a programmable logic circuit that is embedded in said semiconductor substrate.

5. A device, comprising:
   a die;
   a circuit board having at least one first electrode;
   a first interposer provided between said die and said circuit board, said first interposer having at least one first conductive path to be electrically connected to the first electrode of said circuit board;
   a second semiconductor interposer in which a measurement instrument is embedded, said second semiconductor interposer being inserted between said die and said first interposer, said second semiconductor interposer having at least one first conductive path for electrically connecting said die to the first conductive path of said first interposer, said first conductive path of said second interposer being electrically connected to said embedded measurement instrument;
   said circuit board having at least one second electrode that is electrically connected to an interface port; and
   said first interposer having at least one second conductive path for electrically connecting said embedded measurement instrument to the second electrode of said circuit board;
   wherein a signal is transferred between said die and said interface port through said measurement instrument.

6. The device as recited in claim 5, wherein said second semiconductor interposer is a silicon-carrier substrate, and said conductive paths of said second silicon-carrier substrate are through-silicon-vias.

7. The device as recited in claim 5 wherein the physical placement of said conductive paths on said second interposer allow said die to be mounted directly on said first interposer when said measurement instrument is not needed.

8. The device as recited in claim 5 wherein there are a plurality of said measurement instruments, and the majority of said first conductive paths of said second interposer are electrically connected to separate instances of said plurality of said measurement instruments.

9. The device as recited in claim 5 further comprising either a memory or a programmable logic circuit that are embedded in said second semiconductor interposer.

10. The device as recited in claim 1 further comprising either a memory or a programmable logic circuit that is embedded in said semiconductor substrate.

11. The device as recited in claim 1, wherein said semiconductor substrate is a silicon-carrier substrate.

12. The device as recited in claim 1, wherein said interface port is a JTAG interface port.

13. The device as recited in claim 3, wherein said semiconductor substrate is a silicon-carrier substrate.

14. The device as recited in claim 3, wherein said interface port is a JTAG interface port.

* * * * *